United States Patent
Lin et al.

(10) Patent No.: US 11,315,656 B1
(45) Date of Patent: Apr. 26, 2022

(54) DETECTION CIRCUIT AND DETECTION METHOD

(71) Applicant: REALTEK SEMICONDUCTOR CORP., Hsinchu (TW)

(72) Inventors: Shih-Han Lin, Hsinchu (TW); Chun-Chi Yu, Hsinchu (TW); Chih-Wei Chang, Hsinchu (TW); Gerchih Chou, San Jose, CA (US); Shih-Chang Chen, Hsinchu (TW); Kuo-Wei Chi, Hsinchu (TW); Fu-Chin Tsai, Hsinchu (TW); Min-Han Tsai, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/182,324

(22) Filed: Feb. 23, 2021

(51) Int. Cl.
*G11C 29/00* (2006.01)
*G11C 29/50* (2006.01)
*G11C 11/401* (2006.01)

(52) U.S. Cl.
CPC ...... *G11C 29/50004* (2013.01); *G11C 11/401* (2013.01)

(58) Field of Classification Search
CPC ............. G11C 29/50004; G11C 29/50; G11C 29/5004; G11C 11/401; G11C 11/40; G11C 11/34; G11C 11/21
See application file for complete search history.

(56) References Cited

U.S. PATENT DOCUMENTS

| | | | |
|---|---|---|---|
| 10,613,955 B2* | 4/2020 | Pappu | G06F 11/2736 |
| 2013/0019117 A1* | 1/2013 | Michalak | G06F 1/3296 713/340 |
| 2020/0183610 A1* | 6/2020 | Seetharaman | G06F 3/0616 |
| 2021/0318705 A1* | 10/2021 | Yun | G11C 11/4074 |

* cited by examiner

Primary Examiner — Christine T. Tu
(74) Attorney, Agent, or Firm — Li & Cai Intellectual Property (USA) Office

(57) ABSTRACT

A detection circuit and a detection method are provided. The detection circuit is suitable for a system-on-chip (SoC). The SoC is coupled to an alarm pin of a DDR4 memory through a connection pad, and the detection circuit includes a control circuit coupled to the connection pad. In response to the DDR4 memory performing a refresh process or a specific event occurring, the control circuit outputs a test signal with a first voltage level to the connection pad, and determines whether a voltage level of the connection pad is tied to a second voltage level. In response to determining that the voltage level of the connection pad is tied to the second voltage level, the control circuit outputs an interrupt signal to a CPU of the SoC, and the interrupt signal indicates that the alarm pin of the DDR4 memory is not controlled normally by the DDR4 memory.

16 Claims, 3 Drawing Sheets

DETECTION CIRCUIT AND DETECTION METHOD

FIELD OF THE DISCLOSURE

The present disclosure relates to a detection circuit and a detection method, and more particularly to a detection circuit and a detection method capable of actively detecting whether an ALERT_n pin of a fourth-generation double-data-rate (DDR4) memory is controlled normally by a DDR4 memory.

BACKGROUND OF THE DISCLOSURE

When a cyclic redundancy check (CRC) error or a Command/Address/Parity error occurs, a DDR4 memory can pull a voltage level of an alarm pin, that is, an ALERT_n pin, from a high voltage level to a low voltage level in order to notify a host that an error has occurred. In other words, the ALERT_n pin can be used to confirm whether commands and data are correctly written into the DDR4 memory. However, when the ALERT_n pin is accidentally or maliciously connected to an operation voltage VDD (e.g., may be forced by a hacker), the ALERT_n pin cannot be pulled down by the DDR4 memory. In this case, debugging functions of the DDR4 memory will be invalid, it allows the data content of the DDR4 memory being erased or modified. Therefore, providing a circuit and a method that apply active detection on the ALERT_n pin of the DDR4 memory has become an important issue in the art.

SUMMARY OF THE DISCLOSURE

In response to the above-referenced technical inadequacies, one aspect of the present disclosure provides a detection circuit for a system-on-chip (SoC), which is coupled to an alarm pin of a fourth-generation double data rate (hereinafter referred to as DDR4) memory through a connection pad, and the detection circuit includes a control circuit coupled to the connection pad. The control circuit is configured to, in response to the DDR4 memory performing a refresh process or a specific event occurring, output a test signal with a first voltage level to the connection pad and determine whether a voltage level of the connection pad is tied to a second voltage level. In response to determining that the voltage level of the connection pad is tied to the second voltage level, the control circuit outputs an interrupt signal to a central processing unit (CPU) of the SoC, and the interrupt signal indicates that the alarm pin of the DDR4 memory is not controlled normally by the DDR4 memory.

In addition, an embodiment of the present invention provides a detection method, which is applicable to a system-on-chip (SoC). The system-on-chip is coupled to an alarm pin of a DDR4 memory through a connection pad, and the detection method includes the following steps: configuring a control circuit to, in response to the DDR4 memory performing a refresh process or a specific event occurring, output a test signal with a first voltage level to the connection pad and determine whether a voltage level of the connection pad is tied to a second voltage level; configuring the control circuit to, in response to determining that the voltage level of the connection pad is tied to the second voltage level, output an interrupt signal to a central processing unit (CPU) of the SoC, and the interrupt signal indicates that the alarm pin of the DDR4 memory is not controlled normally by the DDR4 memory.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Drawings of the present disclosure are merely schematic illustrations, and are not depicted in actual size. The following embodiments will further describe related technical content of the present disclosure in detail, but the provided content is not intended to limit the scope of the present disclosure.

The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like. In addition, the term "or" used in the present disclosure shall, depending on the actual situation, possibly include any one or a combination of the related listed items.

Figure 1:
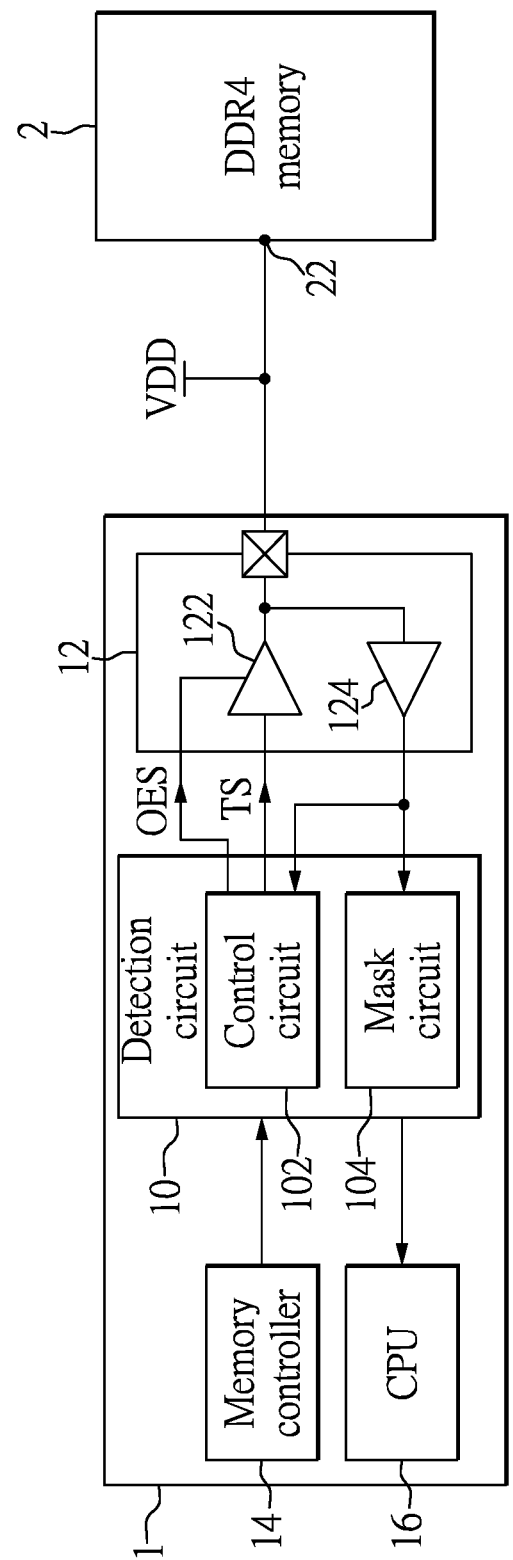
FIG. 1 is a block diagram of a detection circuit according to an embodiment of the present disclosure.

Reference is made to FIG. 1. FIG. 1 is a block diagram of a detection circuit according to an embodiment of the present disclosure. As shown in FIG. 1, when a hacker use an external circuit to connect an ALERT_n pin 22 (that is, an alarm pin) of a DDR4 memory 2 to an operation voltage VDD, the hacker can use forged commands or addresses in an attempt to modify or attack a protection region with a specific address in the DDR4 memory 2. At this time, a voltage level of the ALERT_n pin 22 cannot be pulled down by the DDR4 memory 2 and the function of abnormality notification is disabled.

In view of the above situation, the ALERT_n pin 22 of the DDR4 memory 2 in the present embodiment uses an internal circuit to establish active detection on whether the ALERT_n pin 22 is controlled normally by the DDR4 memory 2, without making modifications or adding hardware to the external circuit, and without violating a DDR transmission protocol. Therefore, a detection circuit 10 is applicable to a system-on-chip (hereinafter referred to as SoC) 1 and the SoC 1 is coupled to the ALERT_n pin 22 of the DDR4 memory 2 through a connection pad 12.

In this embodiment, the DDR4 memory 2 can be a DDR4 dynamic random access memory (DRAM), but the present disclosure is not limited thereto, and the present disclosure does not limit specific implementation of the SoC 1. In short, the SoC 1 can further include a memory controller 14 and a central processing unit (hereinafter referred to as CPU) 16, and the detection circuit 10 is coupled to the connection pad 12, the memory controller 14 and the CPU 16.

The detection circuit 10 includes a control circuit 102 and a mask circuit 104. The control circuit 102 is coupled to the connection pad 12 and configured to, in response to the DDR4 memory 2 performing a refresh process or the occurrence of a specific event, output a test signal TS with a first voltage level to the connection pad 12 and determine whether a voltage level of the connection pad 12 is tied to a second voltage level. In this embodiment, the first voltage level and the second voltage level are respectively a low voltage level and a high voltage level, but in other embodiments, if the ALERT_n pin 22 is accidentally or maliciously connected to a ground voltage, the first voltage level and the second voltage level can be changed to a high voltage level and a low voltage level, respectively. In a word, the first voltage level and the second voltage level are opposite voltage levels, and in the following paragraphs marks L or H with bracket will be used to indicate whether a specific signal is at the low voltage level or the high voltage level.

It is noted that when the control circuit 102 outputs the test signal TS with the first voltage level (L) to the connection pad 12, if the ALERT_n pin 22 is not forcibly connected to the operation voltage VDD from the external circuit, the test signal TS can feedback to the internal circuit through the connection pad 12, such that the CPU 16 can receive the test signal TS with the first voltage level (L) and mistakenly determine that this is a notification of an occurrence of a CRC error or Command/Address/parity error issued by the DDR4 memory 2. Therefore, the mask circuit 104 is coupled to the connection pad 12, and is configured to shield the test signal TS fed back through the connection pad 12 when the control circuit 102 outputs the test signal TS to the connection pad 12, such that the CPU 16 is unable to receive the test signal TS.

In this embodiment, when it is determined that the voltage level on the connection pad 12 is tied to the second voltage level (H), it is likely that the connection pad 12 and the ALERT_n pin 22 are forcibly connected to the operation voltage VDD by the external circuit. Therefore, the control circuit 102 outputs an interrupt signal IS (not shown in FIG. 1, reference can be made to FIG. 2) to notify the CPU 16 that the ALERT_n pin 22 is not controlled normally by the DDR4 memory 2. In other words, the control circuit 102 outputs the interrupt signal IS to the CPU 16, and the interrupt signal IS alerts that the ALERT_n pin 22 is not controlled normally by the DDR4 memory 2.

Specifically, the DDR4 memory 2 performs a refresh process according to a refresh command issued by a host (not shown in FIG. 1). In addition, the specific event can be a case that the DDR4 memory has not been initialized (i.e., uninitialized) or is in an idle state, but the present disclosure is not limited thereto. Although the host did not issue the refresh command when the above situation occurred, since the DDR4 memory 2 is not executing read process and write process at the moment, the control circuit 102 can also output the test signal TS with the first voltage level (L) to the connection pad 12, and determine whether the voltage level of the connection pad 12 is tied to the second voltage level (H).

In other words, before the control circuit 102 outputs the test signal TS with the first voltage level (L) to the connection pad 12, and determine whether the voltage level of the connection pad is tied to the second voltage level (H), the detection circuit will wait for the host to send the refresh command or the occurrence of the specific event. In addition, although the connection pad 12 is a two-way transmission interface, under normal operation, the connection pad 12 can only be used to receive an ALERT_n signal transmitted by the DDR4 memory 2. Therefore, before the control circuit 102 outputs the test signal TS to the connection pad 12, the control circuit 102 can first generate an output enable signal OES to the connection pad 12 to enable an output mode of the connection pad 12.

To facilitate the following description, the connection pad 12 of this embodiment will use input/output (I/O) units 122 and 124 to indicate the output mode and an input mode of the connection pad 12. As shown in FIG. 1, in addition to an input terminal and an output terminal, the I/O unit 122 also includes an output enable terminal to receive the output enable signal OES generated by the control circuit 102. After the output mode of the connection pad 12 is enabled, the input terminal of the I/O unit 122 receives the test signal TS output by the control circuit 102, and outputs the test signal TS through the output terminal of the connection pad. In addition, an input terminal of the I/O unit 124 is coupled to the output terminal of the input output unit 122 to feed the test signal TS back to the internal circuit.

In contrast, in this embodiment, when it is determined that the voltage level of the connection pad 12 is not tied to the second voltage level (H), it means that the connection pad 12 and the ALERT_n pin 22 are not forcibly connected to the operation voltage VDD from the external circuit. Therefore, the control circuit 102 can generate an output disable signal (not shown in FIG. 1) to disable the output mode of the connection pad 12 to avoid bus conflicts, and the detection circuit 10 can return to a step of waiting for the host to issue a refresh command or a specific event. In a word, under normal operation, the output mode of the connection pad 12 is disabled, such that the input terminal of the I/O unit 124 only receives the ALERT_n signal transmitted by the DDR4 memory 2, and inputs the ALERT_n signal to the internal circuit through the output terminal of the I/O unit 124.

Figure 2:
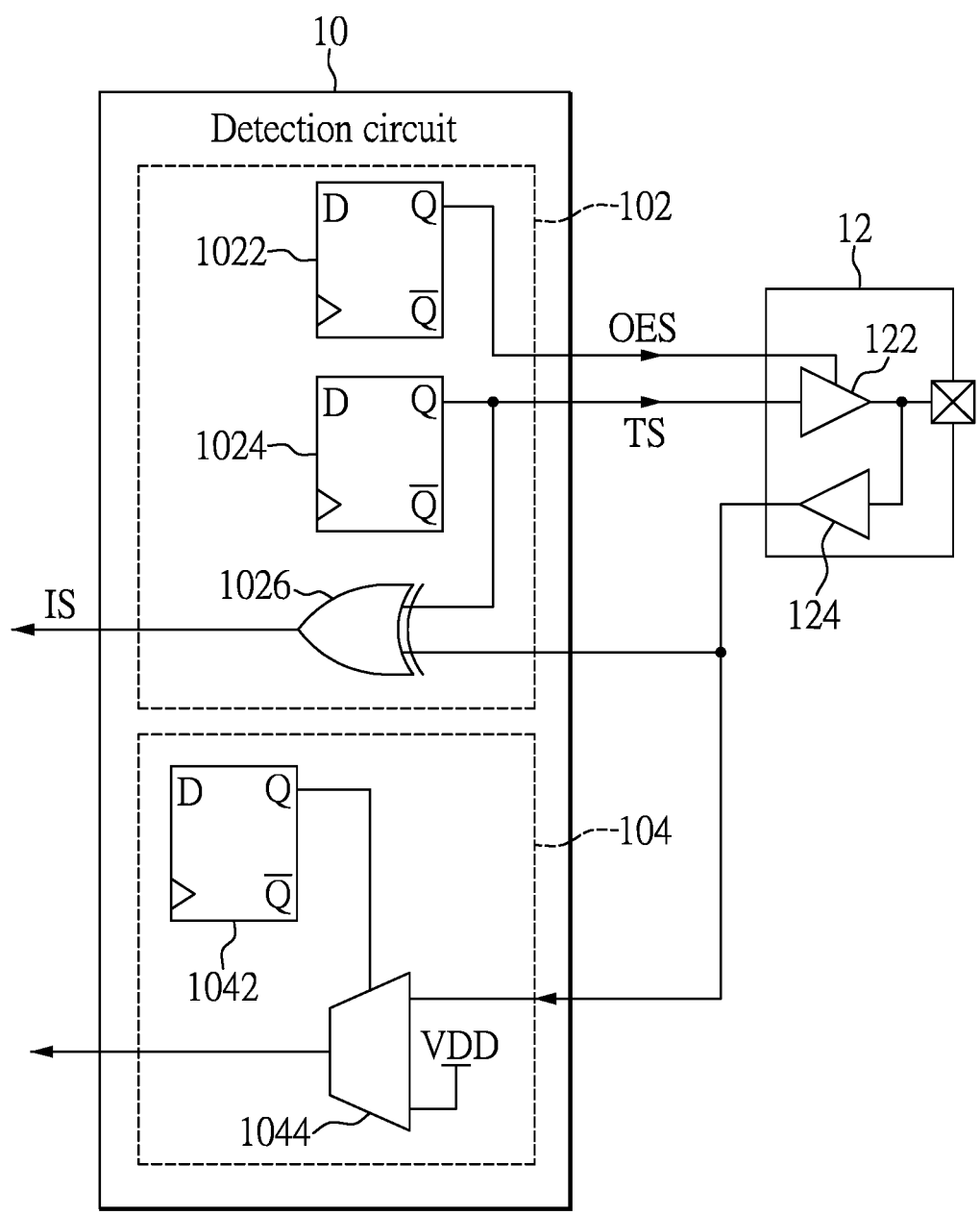
FIG. 2 is a schematic circuit diagram of the detection circuit of FIG. 1.

It is understood that the I/O unit 122 is equivalent to a three-state logic buffer, and the output enable signal OES and the output disable signal can be implemented by a single digital signal. For example, a digital signal with logic level 1 can be used to represent the output enable signal OES, and a digital signal with logic level 0 can be used to represent the output disable signal, but the present disclosure is not limited thereto. Reference can also be made to FIG. 2, which is a circuit diagram of the detection circuit 10 of FIG. 1.

As shown in FIG. 2, the control circuit 102 can include a D-type flip-flop (hereinafter referred to as DFF) 1022, 1024 and an exclusive-OR (hereinafter referred to as XOR) gate 1026. The DFF 1022 is used to generate the output enable signal OES, and the DFF 1024 is used to output the test signal TS with the first voltage level (L), and two input terminals of the XOR gate 1026 respectively receive the test signal TS output by the DFF 1024 and the test signal TS fed back through the I/O unit 124. In other words, the control circuit 102 can check whether the output test signal TS with the first voltage level (L) is different from the test signal TS fed back through the connection pad 12 (e.g., whether these two signals are at the same voltage level), and then determine whether the voltage level of the connection pad 12 is tied to the second voltage level (H).

If the test signal TS with the first voltage level (L) output by the control circuit 102 is different from the test signal TS fed back through the connection pad 12, the control circuit 102 can determine that the voltage level of the connection pad 12 is tied to the second voltage level (H), and output an interrupt signal IS with a high logic level (e.g., logic level 1) through the XOR gate 1026 to notify the CPU 16 that the ALERT_n pin 22 is not controlled normally by the DDR4 memory 2. In contrast, if the test signal TS with the first voltage level (L) output by the control circuit 102 is substantially identical to the test signal TS fed back through the connection pad 12, the control circuit 102 can determine that the voltage level of the connection pad 12 is not tied to the second voltage level (H), and output the interrupt signal IS with a low logic level (e.g., logic level 0) through the XOR gate 1026 (that is equivalent to output no interrupt signal IS), but the logic level of the interrupt signal IS of the present disclosure is not limited thereto.

In addition, the mask circuit 104 can include a DFF 1042 and a data multiplexer 1044. One input terminal of the data multiplexer 1044 is coupled to the output terminal of the I/O unit 124, another input terminal of the data multiplexer 1044 receives the operation voltage VDD, and a selection terminal is coupled to a data output terminal of the DFF 1042. In other words, when the control circuit 102 outputs the test signal TS to the connection pad 12, the data multiplexer 1044 can select the operation voltage VDD as an output through the DFF 1042, such that the CPU 16 cannot receive the test signal TS. In contrast, under normal operation, the data multiplexer 1044 selects and outputs signals transmitted through the connection pad 12 by using the DFF 1042.

Since operating principles of the DFFs, XOR gates, and data multiplexers are all known to those skilled in the arts, the details about the control circuit 102 and the mask circuit 104 are not repeated hereinafter. In a word, implementing the control circuit 102 by the DFFs 1022, 1024 and XOR gate 1026, and implementing the mask circuit 104 by DFF 1042 and the data multiplexer 1044 are merely examples, which are not meant to limit the present disclosure.

Figure 3:
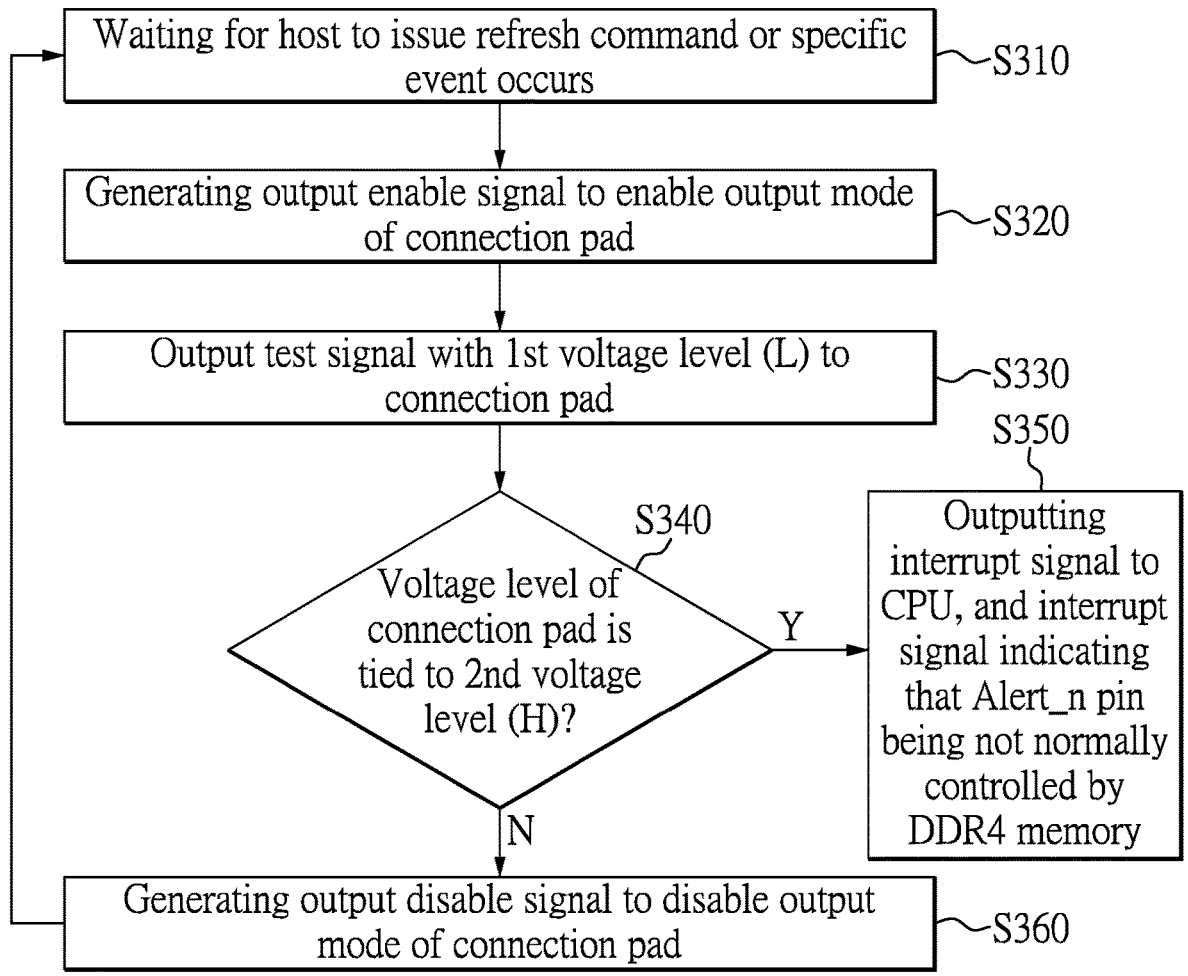
FIG. 3 is a flowchart of steps of a detection method according to an embodiment of the present disclosure.

Finally, reference is also made to FIG. 3, which is a flowchart of steps of a detection method according to an embodiment of the present disclosure. Since the detailed steps and procedures are the same as those described in the previous embodiments, they will only be summarized here and will not be redundantly described.

As shown in FIG. 3, in step S310, the detection circuit 10 of the SoC 1 waits for a host to issue a refresh command or a specific event occurs, and when the DDR4 memory 2 performs a refresh process (i.e., the host issues the refresh command) or the specific event occurs, the detection circuit 10 of the SoC 1 starts to perform step S320. In step S320, the control circuit 102 generates the output enable signal OES to enable the output mode of the connection pad 12, and in step S330, the control circuit 102 outputs the test signal TS with the first voltage level (L) to the connection pad 12. Next, in step S340, the control circuit 102 determines whether the voltage level of the connection pad 12 is tied to the second voltage level (H).

As mentioned above, although the first voltage level is at the low voltage level (L) and the second voltage level a is at the high voltage level (H), but in other embodiments that the ALERT_n pin 22 is accidentally or maliciously connected to the ground voltage, the first voltage level and the second voltage level can be changed to the high voltage level (H) and the low voltage level (L), respectively. In addition, in order to avoid wrong determination of the CPU unit 16 while receiving the test signal TS, when the control circuit 102 outputs the test signal TS to the connection pad 12, the mask circuit 104 is configured to shield the test signal TS fed back through the connection pad 12. However, the flowchart in FIG. 3 omits this step.

Then, when it is determined that the voltage level of the connection pad 12 is tied to the second voltage level (H), the detection circuit 10 of the SoC 1 performs step S350 to determine that the voltage level of the connection pad 12 is not tied to the second voltage level (H), the detection circuit 10 of the SoC 1 performs step S360. In step S350, the control circuit 102 is configured to output the interrupt signal IS to the CPU 16, and the interrupt signal IS indicates that the ALERT_n pin 22 is not controlled normally by the DDR4 memory 2.

In addition, in step S360, the control circuit 102 generates the output disable signal to disable the output mode of the connection pad 12, and returns to step S310. As mentioned above, since the connection pad 12 will not be switched to the output mode under normal operation, after the detection circuit performs step S350, the control circuit 102 can also generate an output disable signal to disable the output mode of the connection pad 12, and the method returns to step S310, but the flowchart of FIG. 3 omits this step.

In conclusion, since a memory needs to be refreshed periodically, the detection circuit and the detection method of the present disclosure can actively detect whether the ALERT_n pin is controlled normally by the DDR4 memory in a fixed period or when a specific event occurs. In addition, the detection circuit and the detection method of the present disclosure can be implemented without making additional modifications or adding hardware to an external circuit, and without violating a DDR transmission protocol.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A detection circuit for a system-on-chip (SoC) coupled to an alarm pin of a fourth-generation double data rate (DDR4) memory through a connection pad, and the detection circuit comprising:
   a control circuit coupled to the connection pad and configured to, in response to the DDR4 memory performing a refresh process or an occurrence of a specific event, output a test signal with a first voltage level to the connection pad and determine whether a voltage level of the connection pad is tied to a second voltage level,
   wherein, in response to determining that the voltage level of the connection pad is tied to the second voltage level, the control circuit is configured to output an interrupt signal to a central processing unit (CPU) of the SoC, and the interrupt signal indicates that the alarm pin of the DDR4 memory is not controlled normally by the DDR4 memory.

2. The detection circuit according to claim 1, wherein the specific event is that the DDR4 memory is uninitialized or is in an idle state.

3. The detection circuit according to claim 1, further comprising:
   a mask circuit coupled to the connection pad and configured to shield the test signal fed back through the connection pad when the control circuit outputs the test signal to the connection pad, such that the CPU of the SoC is unable to receive the test signal.

4. The detection circuit according to claim 1, wherein, before the control circuit is configured to output the test signal to the connection pad, and determine whether the voltage level of the connection pad is tied to the second voltage level, the detection circuit is configured to wait for a host to send a refresh command or the occurrence of the specific event.

5. The detection circuit according to claim 4, wherein, before the control circuit is configured to output the test signal to the connection pad, the control circuit further generates an output enable signal to enable an output mode of the connection pad.

6. The detection circuit according to claim 5, wherein, in response to determining that the voltage level of the connection pad is not tied to the second voltage level, the control circuit generates an output disable signal to disable the output mode of the connection pad, and the detection circuit is configured to return to wait for the host to send the refresh command or the occurrence of the specific event.

7. The detection circuit according to claim 1, wherein the control circuit is configured to determine whether the voltage level of the connection pad is tied to the second voltage level by checking whether the test signal with the first voltage level output by the control circuit is different from the test signal fed back from the connection pad.

8. The detection circuit according to claim 7, wherein, in response to the test signal with the first voltage level output by the control circuit being different from the test signal fed back through the connection pad, the control circuit is configured to determine that the voltage level of the connection pad is tied to the second voltage level, and output the interrupt signal with a high logic level to the CPU.

9. A detection method for a system-on-chip (SoC) coupled to an alarm pin of a fourth-generation double data rate (DDR4) memory through a connection pad, and the detection method comprising:
    configuring a control circuit to, in response to the DDR4 memory performing a refresh process or an occurrence of a specific event, output a test signal with a first voltage level to the connection pad and determine whether a voltage level of the connection pad is tied to a second voltage level; and
    configuring the control circuit to, in response to determining that the voltage level of the connection pad is tied to the second voltage level, output an interrupt signal to a central processing unit (CPU) of the SoC, wherein the interrupt signal indicates that the alarm pin of the DDR4 memory is not controlled normally by the DDR4 memory.

10. The detection method according to claim 9, wherein the specific event is that the DDR4 memory is uninitialized or is in an idle state.

11. The detection method according to claim 9, further comprising:
    configuring a mask circuit to shield the test signal fed back through the connection pad when the control circuit outputs the test signal to the connection pad, such that the CPU of the SoC is unable to receive the test signal.

12. The detection method according to claim 9, further comprising:
    waiting for a host to send a refresh command or the occurrence of the specific event before configuring the control circuit to output the test signal to the connection pad and determine whether the voltage level of the connection pad is tied to the second voltage level.

13. The detection method according to claim 12, further comprising:
    configuring the control circuit to generate an output enable signal to enable an output mode of the connection pad before configuring the control circuit to output the test signal to the connection pad.

14. The detection method according to claim 13, further comprising:
    in response to determining that the voltage level of the connection pad is not tied to the second voltage level, configuring the control circuit to generate an output disable signal to disable the output mode of the connection pad, and returning to a step of waiting for the host to send the refresh command or the occurrence of the specific event.

15. The detection method according to claim 9, further comprising:
    configuring the control circuit to check whether the test signal with the first voltage level output by the control circuit is different from the test signal fed back from the connection pad to determine whether the voltage level of the connection pad is tied to the second voltage level.

16. The detection method according to claim 15, further comprising:
    in response to the test signal with the first voltage level output by the control circuit being different from the test signal fed back through the connection pad, configuring the control circuit to determine that the voltage level of the connection pad is tied to the second voltage level, and output the interrupt signal with a high logic level to the CPU.

* * * * *